US007476932B2

(12) United States Patent
Zhang et al.

(10) Patent No.: US 7,476,932 B2
(45) Date of Patent: Jan. 13, 2009

(54) U-SHAPE METAL-OXIDE-SEMICONDUCTOR (UMOS) GATE STRUCTURE FOR HIGH POWER MOS-BASED SEMICONDUCTOR DEVICES

(75) Inventors: Qingchun Zhang, Cary, NC (US); Hsueh-Rong Chang, Los Angeles, CA (US)

(73) Assignee: The Boeing Company, Chicago, IL (US)

( * ) Notice: Subject to any disclaimer, the term of this patent is extended or adjusted under 35 U.S.C. 154(b) by 210 days.

(21) Appl. No.: 11/537,454

(22) Filed: Sep. 29, 2006

(65) Prior Publication Data
US 2008/0079065 A1    Apr. 3, 2008

(51) Int. Cl.
*H01L 29/76* (2006.01)
*H01L 21/336* (2006.01)

(52) U.S. Cl. .............. 257/330; 257/332; 257/E29.26; 257/E21.428; 438/270; 438/272

(58) Field of Classification Search ................ 257/330, 257/332, E29.26, E21.428; 438/270, 272
See application file for complete search history.

(56) References Cited

U.S. PATENT DOCUMENTS 5,506,421 A * 4/1996 Palmour ............... 257/77
5,831,288 A * 11/1998 Singh et al. ............... 257/77
6,392,273 B1 * 5/2002 Chang .................. 257/330
2004/0145011 A1 * 7/2004 Hsu et al. ............... 257/330
2005/0173758 A1 * 8/2005 Peake et al. ............ 257/330
2006/0289928 A1 * 12/2006 Takaya et al. ........... 257/330

* cited by examiner

*Primary Examiner*—Tuan N. Quach
(74) *Attorney, Agent, or Firm*—MacPherson Kwok Chen & Heid LLP; Greg J. Michelson

(57) ABSTRACT

A U-shape Metal-Oxide-Semiconductor (UMOS) device comprises a P-base layer, an N+ source region disposed in the P-base layer where the source region has a first surface coplanar with a first surface of the P-base layer, a dielectric layer extending through the P-base layer and forming a U-shape trench having side walls and floor enclosing a trench interior region, a conducting gate material filling the trench interior region, a first accumulation channel layer disposed along a first side wall of the U-shape trench and in contact with the source region and a first side wall of the U-shape trench, a P-junction gate disposed adjacent to the dielectric layer floor and in proximity to the first accumulation channel layer, and an N-drift region where the P-junction gate is disposed between the dielectric layer and the N-drift region.

24 Claims, 2 Drawing Sheets

U-SHAPE METAL-OXIDE-SEMICONDUCTOR (UMOS) GATE STRUCTURE FOR HIGH POWER MOS-BASED SEMICONDUCTOR DEVICES

TECHNICAL FIELD

The present invention relates generally to semiconductor devices, and particularly to a U-shape Metal Oxide Semiconductor (UMOS) gate structure for high power MOS-based semiconductor devices.

BACKGROUND

For a high power semiconductor device with a U-shape gate, such as U-shape Metal Oxide Semiconductor Field Effect Transistors (UMOSFETs) or Trench Insulated Gate Bipolar Transistors (IGBTs), the UMOS gate corners may be exposed to a high electrical field under the OFF state providing increased field stress. This increased field stress can degrade the device blocking rating significantly and may result in a low manufacturing yield. Even if a junction with opposite polarity to the drift region, a junction gate, is introduced to relieve the field stress, a narrow gap between the junction gates may cause the depletion layer to pinch off and reduce forward conduction current capability. Moreover, the introduction of a gate junction can cause depletion pinching off between the gate junction and base junction in the MOS channel, if the spacing is not adequate. Typically, adequate spacing requires deeper mesa etching, which may increase process complexity. For high power devices, the drift region is normally lightly doped, thus the spacing between the junction and channel must be more than several microns, which creates significant difficulties during fabrication, and specifically in an etching process for such a deep mesa. This problem is compounded when using Silicon Carbide (SiC) or other hard semiconductor materials. Hence, there remains a need in the art for a UMOS gate structure that addresses these and other deficiencies in a cost effective manner.

SUMMARY

Apparatuses, systems, and methods are disclosed herein which may provide a U-shape Metal-Oxide-Semiconductor (UMOS) gate structure for high power MOS-based devices in a cost-effective manner for a multitude of commercial and military applications. Specifically, apparatuses, devices, and methods are disclosed herein that may provide a UMOS gate structure to solve existing disadvantages, and to provide a buffer layer introduced between a drift region and a base region, where the doping and thickness of the buffer layer are carefully selected in order to create an accumulation conducting channel along a Metal Oxide Semiconductor (MOS) sidewall in order to reduce or eliminate Junction Field Effect Transistor (JFET) effects between adjacent UMOS junction and to keep a shallow UMOS gate trench depth. The buffer layer may have the same polarity as the drift region with a $1\times10^{15}$-$1\times10^{16}$ doping concentration, and a thickness of between about 1-2 microns. A junction gate is introduced in a trench floor that may be blanket doped or locally doped. The local junction gate can further decrease the device forward resistance. Further, embodiments of the present invention may address problems related to a typically low inversion channel mobility and how the depletion region from gate junction typically increases device resistance.

In accordance with an embodiment of the present invention, a U-shape Metal-Oxide-Semiconductor device includes a P-base layer, an N+ source region disposed in the P-base layer where the N+ source region has a first surface that is coplanar with a first surface of the P-base layer, a dielectric layer extending through the P-base layer and forming a U-shape trench having side walls and a floor enclosing a trench interior region, a conducting gate material filling the U-shape trench interior region, a first accumulation channel layer along a first side wall of the U-shape trench and in contact with the N+ source region and the first side wall of the U-shape trench, a P-junction gate disposed adjacent to the dielectric layer floor and in proximity to the first accumulation channel layer, and an N-drift region, wherein the P-junction gate is disposed between the dielectric layer and the N-drift region.

According to another embodiment, a gate structure for a U-shape Metal-Oxide-Semiconductor device includes a P-base layer having a first surface and a second surface, a doped buffer layer having a first surface and a second surface where a portion of the doped buffer layer first surface is adjacent to the P-base second surface, a dielectric layer extending through the P-base layer and into the doped buffer layer to form a U-shape trench having side walls and a floor enclosing a U-shape trench interior region, a conducting gate material filling the U-shape trench interior region, a P-junction gate having a first side that is adjacent to the trench floor and where remaining surfaces of the P-junction gate are in contact with the doped buffer layer, a N-drift region having a first surface and a second surface where the N-drift region first surface is adjacent to the doped buffer layer second surface, an N+ source region disposed in the P-base layer with a first surface that is coplanar with the first surface of the P-base layer, a first accumulation channel layer disposed along a first side wall of the U-shape trench and in contact with the N+ source region, a N+ drain region adjacent to a second wall of the U-shape trench where the second side wall is disposed on a side opposite from the first side wall, and a second accumulation channel layer disposed along the second side wall of the trench and in contact with the N+ drain region.

According to yet another embodiment of the present invention, a method is provided of using a UMOS field effect transistor (FET) where the UMOS FET includes a P-base layer, an N+ source region disposed in the P-base layer where the N+ source region has a first surface that is coplanar with a first surface of the P-base layer where the N+source region has a source terminal in electrical contact with the N+ source region, a dielectric layer extending through the P-base layer and forming a U-shape trench having side walls and a floor enclosing a trench interior region, a conducting gate material filling the U-shape trench interior region where the conducting gate material has a gate terminal in electrical contact with the conducting gate material, a first accumulation channel layer along a first side side wall of the U-shape trench and in contact with the N+ source region and a first side wall of the U-shape trench, a P-junction gate disposed adjacent to the dielectric layer floor and in proximity to the first accumulation channel layer, an N-drift region where the P-junction gate is disposed between the dielectric layer and the N-drift region, a N+ drain region adjacent to a second side wall of the U-shape trench where the second wall is disposed on a side opposite from the first side wall and where the N+ drain region has a drain terminal in electrical contact with the N+ drain region, and a second accumulation channel layer along the second side wall of the U-shape trench and in contact with the N+ drain region, where the method of using the UMOS FET comprises the operation of applying a controlling voltage to the gate terminal. The controlling voltage applied to the UMOS FET is effective in controlling the flow of electrical current through the source terminal and the drain terminal.

According to yet another embodiment of the present invention, a method is provided of making a UMOS field effect transistor (FET) device includes providing a P-base layer having a first surface and a second surface, providing a doped buffer layer having a first surface and a second surface where a portion of the doped buffer layer first surface is adjacent to the P-base second surface, providing a dielectric layer extending through the P-base layer and into the doped buffer layer to form a U-shape trench having side walls and a floor enclosing a U-shape trench interior region, providing a conducting gate material filling the U-shape trench interior region, and providing a P-junction gate having a first surface that is adjacent to the trench floor where remaining surfaces of the P-junction gate being in contact with the doped buffer layer, and where a distance between the trench floor and the doped buffer layer second surface is sufficient to provide a junction depletion region wholly embedded within the doped buffer layer.

The scope of the present invention is defined by the claims, which are incorporated into this section by reference. A more complete understanding of embodiments of the present invention will be afforded to those skilled in the art, as well as a realization of additional advantages thereof, by a consideration of the following detailed description. Reference will be made to the appended sheets of drawings that will first be described briefly.

BRIEF DESCRIPTION OF THE FIGURES

Embodiments of the present invention and their advantages are best understood by referring to the detailed description that follows. It should be appreciated that like reference numerals are used to identify like elements illustrated in one or more of the figures.

DETAILED DESCRIPTION

In accordance with one or more embodiments of the present invention, a high power metal oxide semiconductor device having a U-shape trench (UMOS) is disclosed where the gate corners may not be exposed to a high electric field during the off state, providing a device blocking rating that may not degrade significantly, and which may provide a higher manufacturing yield. Embodiments of the present invention overcome one or more of the prior art disadvantages, and others, by providing a U-shape Metal Oxide Semiconductor (UMOS) gate structure for high power MOS-based semiconductor devices. Embodiments of the FET UMOS device 100 and the gate structure for a UMOS device may be used in many applications including power amplification, signal conditioning, high-voltage switching, and almost any application that uses traditional UMOSFETs, Insulated Gate Bipolar Transistors (IGBTs), Power Field Effect Transistors (Power FETs), or other traditional UMOS-gate devices.

Figure 1:
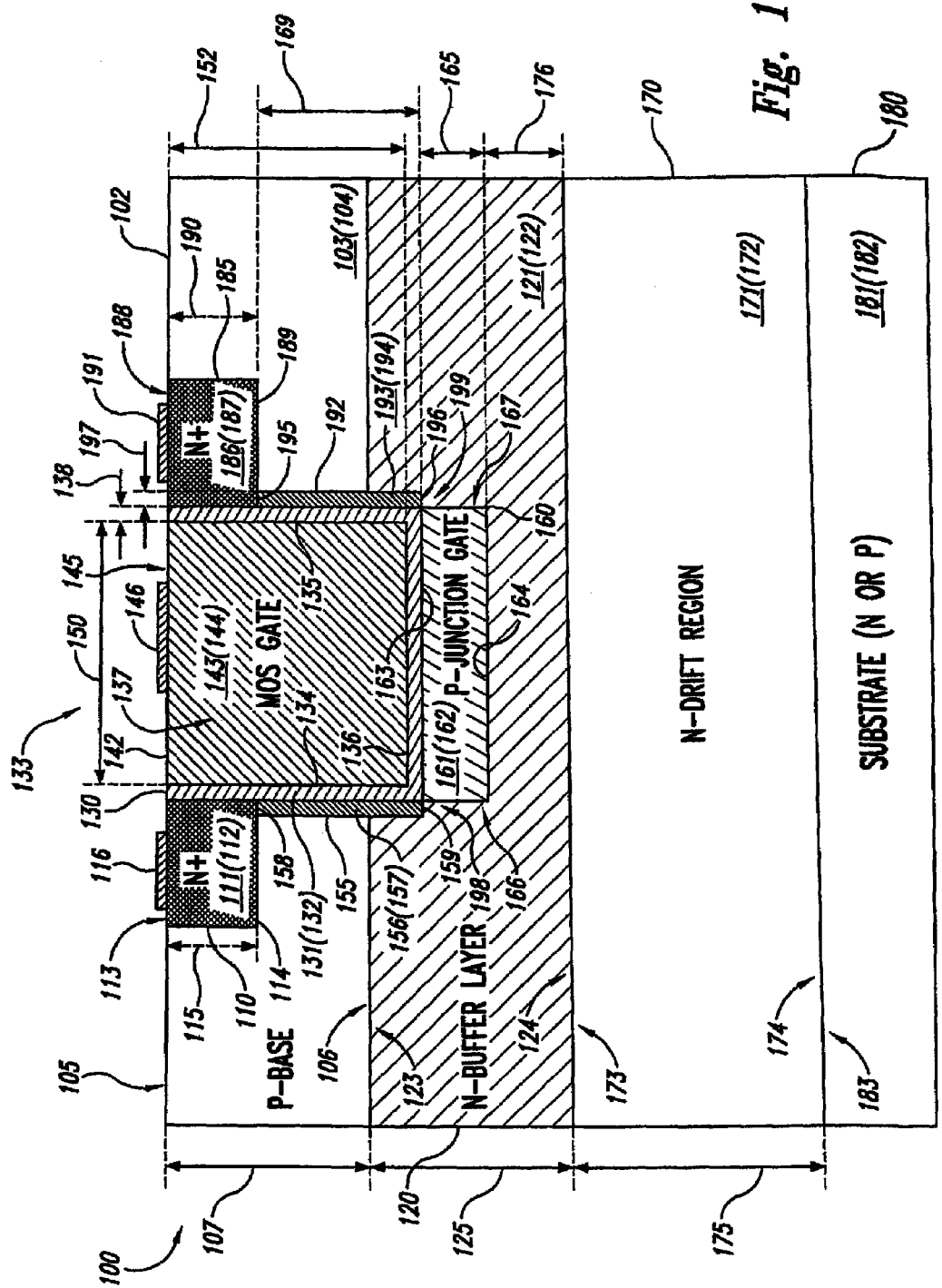
FIG. 1 shows a side view of an exemplary UMOS field effect transistor (FET) device, in accordance with an embodiment of the present invention.

FIG. 1 shows a side view of an exemplary UMOS field effect transistor (FET) device 100, in accordance with an embodiment of the present invention. FET device 100 comprises a U-shape Metal-Oxide-Semiconductor (UMOS) transistor device and may include a P-base layer 102 composed of a positively (P) doped semiconductor material 103, either silicon (Si) or silicon-carbide (SiC), having a doping concentration 104 from about $1\times10^{16}$ cm$^{-3}$ to about $5\times10^{17}$ cm$^{-3}$ and preferably from about $5\times10^{16}$ cm$^{-3}$ to about $5\times10^{17}$ cm$^{-3}$. Alternatively, the doping concentration 104 may be expressed in terms of resistivity. P-base layer 102 may have a substantially planar first surface 105, a substantially planar second surface 106, and a thickness 107 between the first and second surfaces (105, 106) that typically ranges from about 1.0 microns to about 2.0 microns, and preferably from about 1.0 microns to about 1.5 microns. In this disclosure, dimensions may be measured using $1\times10^{-6}$ of a meter, commonly denoted a micrometer or a micron, or alternatively measured using $1\times10^{-10}$ of a meter, commonly denoted as an angstrom (Å) unit.

FET 100 may also include a source region 110 composed of negatively (N+) doped semiconductor material 111, either silicon (Si) or silicon-carbide (SiC), having a doping concentration 112 from about $1\times10^{18}$ cm$^{-3}$ to about $1\times10^{20}$ cm$^{-3}$ and preferably from about $1\times10^{19}$ cm$^{-3}$ to about $5\times10^{19}$ cm$^{-3}$. Source region 110 is located in the P-base layer 102 and has a first planar surface 113 that is substantially coplanar with first surface 105 of P-base layer 102. Source region 110 may have a second surface 114 that is substantially parallel with first surface 113 where the thickness 115 of source region 110 is the distance between first surface 113 and second surface 114. A source contact 116 provides an electrical connection (i.e. an ohmic contact) to source region 110.

FET 100 may also include a doped buffer layer 120 that may preferably be composed of silicon (Si) or silicon-carbide (SiC) and may be a negatively (N) doped semiconductor material 121 having a doping concentration 122 of about $5\times10^{15}$ cm$^{-3}$ to about $5\times10^{16}$ cm$^{-3}$, and preferably from about $5\times10^{15}$ cm$^{-3}$ to about $1\times10^{16}$ cm$^{-3}$. Conversely, doped buffer layer 120 may be a positively (P) doped semiconductor material having a doping concentration 122 from about $5\times10^{15}$ cm$^{-3}$ to about $5\times10^{16}$ cm$^{-3}$, and preferably from about $5\times10^{15}$ cm$^{-3}$ to about $1\times10^{16}$ cm$^{-3}$. The doped buffer layer 120 may have a substantially planar first surface 123 that may be adjacent to the P-base layer 102 second surface 106 and a substantially planar second surface 124, with a thickness 125 between the first and second surfaces (123, 124) that typically ranges from about 1.0 microns to about 2.0 microns, and preferably from about 1.0 microns to about 1.5 microns.

FET 100 may also include a dielectric layer 130 that is preferably composed of a silicon-dioxide (SiO2) but may alternatively be composed of silicon nitride (Si3N4). Dielectric layer 130 extends entirely through P-base layer 102 and partially through doped buffer layer 120 to form a U-shape trench 133 having a first side wall 134, a second and opposing side wall 135, and a floor 136 enclosing a trench interior region 137. Dielectric layer 130 has a thickness 138 that typically ranges from about 500 Å to about 800 Å, and is preferably from about 500 Å to about 600 Å. The thickness 138 of dielectric layer 130 is chosen to maximize the inversion layer charge amount while minimizing the Metal-Oxide-Semiconductor (MOS) threshold voltage. A dielectric film thickness of between about 500 Å to about 600 Å can provide a reasonable threshold voltage between about 2-3 volts while providing a high channel charge conduction capability.

A Metal Oxide Semiconductor (MOS) transistor gate 142 may be composed of silicon (Si), poly-silicon, metal, or silicon-carbide (SiC) and may be a positively (P) doped semiconductor material 143 having a doping concentration 144 from about $5\times10^{17}$ cm$^{-3}$ to about $5\times10^{19}$ cm$^{-3}$, and preferably from about $1\times10^{18}$ cm$^{-3}$ to about $1\times10^{19}$ cm$^{-3}$. The positively doped semiconductor material 143 fills the trench interior region 137 and has a first surface 145 that is substantially coplanar with the first surface 105 of P-base layer 102. Alternatively, any conductive material may be used as gate filling. A gate contact 146 provides an electrical connection (i.e. an ohmic contact) to the conducting gate material 143 filling trench interior region 137. The side walls (134, 135) and floor 136 form a U-shape gate structure 147 as seen in the side view of FIG. 1. A distance 150 between a surface of first side wall 134 and an opposing second side wall 135 corresponds to a length 150 of the gate 142. The product of a width (not shown) of gate 142 along with the length 150 of gate 142 defines a parameter used in calculating the drive strength or current carrying capacity of FET 100. The length 150, width (not shown), and a depth 152 define the volume of gate material 143 and the volume of interior region 137. The depth 152 may be between about 1.5 microns to about 2.0 microns. Minimizing the length 150 provides a high channel density and a low gate resistance.

FET 100 may also include a first accumulation channel layer 155 that may preferably be composed of silicon (Si) or silicon-carbide (SiC) and may be a negatively (N) doped semiconductor material 156 having a doping concentration 157 from about $1\times10^{15}$ cm$^{-3}$ to about $1\times10^{17}$ cm$^{-3}$, and preferably from about $1\times10^{16}$ cm$^{-3}$ to about $1\times10^{17}$ cm$^{-3}$. First accumulation channel 155 may be located adjacent to an exterior surface of first side wall 134 and have a first end 158 in contact with the second surface 114 of N+ source region 110. The doped buffer layer 120 provides an accumulation conducting channel along the first accumulation layer 155. The accumulation channel may be formed using ion-implantation or epitaxial growth.

FET 100 may also include a P-junction gate 160 that may preferably be composed of silicon (Si) or silicon-carbide (SiC) and may be a positively (P) doped semiconductor material 161 having a doping concentration 162 from about $5\times10^{17}$ cm$^{-3}$ to about $5\times10^{18}$ cm$^{-3}$, and preferably from about $1\times10^{18}$ cm$^{-3}$ to about $5\times10^{18}$ cm$^{-3}$. P-junction gate 160 may have a first surface 163 disposed adjacent to an exterior surface of the dielectric layer floor 136 and a second surface 164 disposed opposite to first surface 163 and separated by a distance 165 comprising the thickness of P-junction gate 160 that may be from about 0.3 microns to about 0.5 microns. P-junction gate 160 is bounded by a third surface 166 having an edge that is substantially parallel to an extension of the outer surface of first wall 134 and in proximity to a second end 159 of the first accumulation channel layer 155. P-junction gate 160 is bounded by a fourth surface 167 having an edge that is substantially parallel to an extension of the outer surface of second wall 135. In this manner, the first surface 163 or side of the P-junction gate layer 160 is directly adjacent to the dielectric layer 130 and the remaining surfaces or sides of the P-junction layer 160 are in contact with the doped buffer layer 120. The P-junction gate 160 may be blanket doped or locally doped. The P-junction gate 160 is considered to be a local junction gate and can further decrease the UMOS FET device 100 forward conduction resistance. Both blanket and local doping can be achieved using implantation. Local gate implantation can further reduce JFET resistance between P-Junction gates.

FET 100 may also include an N-drift region 170 that may preferably be composed of silicon (Si) or silicon-carbide (SiC) and may be a negatively (N) doped semiconductor material 171 having a doping concentration 172 from about $2\times10^{14}$ cm$^{-3}$ to about $1\times10^{17}$ cm$^{-3}$. The N-drift region 170 may have a substantially planar first surface 173 that may be adjacent to the doped buffer layer 120 second surface 124 and a substantially planar second surface 174 disposed opposite of surface 173 so that N-drift region 170 has a thickness 175 between the first and second surfaces (173, 174) that typically ranges from about 5 microns to about 200 microns. The N-drift region 170 first surface 173 is disposed at a predetermined distance 176 from the P-junction gate 160 second surface 164 on a side opposite to the P-base layer 102.

The doping and the thickness of the buffer layer 120 is carefully selected based on at least two considerations. A first consideration is to limit the junction depletion width, thus the spacing between adjacent junction gates can be made small, thus increasing the MOS channel density significantly. The doping of the buffer layer is higher than the drift region 170 for high power devices. A second consideration is to reduce or eliminate the degradation in the blocking capability and even improve this attribute. The MOS trench floor 136 is located within the buffer layer 120, and enough spacing is left between the junction gate 160 bottom surface 164 and the buffer layer 120 second surface 124, so as to have the junction depletion region wholly embedded within the buffer layer 120.

The spacing between the junction gate 160 and channel can be small because of the highly doped buffer layer. In this structure, a first accumulation layer 155 which is to create an accumulation conducting channel, along a MOS sidewall is introduced, either by epitaxial growth or by ion implantation. The doping and the thickness of this accumulation layer are carefully selected so that it may be depleted completely by the junction built-in potential, thus the device operates in the enhancement mode. Further, the junction gate in UMOS trench bottom can be blanket doped, or locally doped. The local junction gate can further decrease the device forward on-resistance because of the depletion region shrinking in the forward bias state of the local gate.

FET 100 may also include a doped substrate 180 that may preferably be composed of silicon (Si) or silicon-carbide (SiC) and may be a negatively (N) or a positively (P) doped semiconductor material 181 having a doping concentration 182 of about $1\times10^{18}$ cm$^{-3}$ to about $1\times10^{19}$ cm$^{-3}$, and preferably from about $5\times10^{18}$ cm$^{-3}$ to about $1\times10^{19}$ cm$^{-3}$. Substrate 180 has a first surface 183 that is adjacent to the N-drift region 170 second surface 174. The thickness of the substrate is typically much larger than the thickness of deposited layers.

FET 100 may also include a drain region 185 composed of negatively (N+) doped semiconductor material 186, either silicon (Si) or silicon-carbide (Sic), having a doping concentration 187 from about $1\times10^{18}$ cm$^{-3}$ to about $5\times10^{19}$ cm$^{-3}$ and preferably from about $5\times10^{18}$ cm$^{-3}$ to about $5\times10^{19}$ cm$^{-3}$. Drain region 185 is located in the P-base layer 102 and has a first planar surface 188 that is substantially coplanar with first surface 105 of P-base layer 102. Drain region 185 may have a second surface 189 that is substantially parallel with first surface 188 where the thickness 190 (i.e. junction depth) of drain region 185 is the distance between first surface 188 and second surface 189. A drain contact 191 provides an electrical connection (i.e. an ohmic contact) to drain region 185. The source contact 116, the gate contact 146, and the drain contact 191 may each be composed of an electrically conductive material including aluminum (Al), copper (Cu), nickel (Ni), silicide (silicon and tantalum), and poly-silicon (polycrystaline silicon). Alternatively, a first P+ region may be disposed on top of P-base layer 102 to permit ohmic contact formation. The first P+ region may have an equivalent junction depth 190 and be composed of either silicon (Si) or silicon-carbide (Sic) having a doping concentration from about $1\times10^{18}$ cm$^{-3}$ to about $1\times10^{20}$ cm$^{-3}$, and preferably from about $5\times10^{15}$ cm$^{-3}$ to about $1\times10^{16}$ cm$^{-3}$. In a further alternative, a second P+ region may be disposed on top of P-base layer 102 to permit ohmic contact formation. The second P+ region may have an equivalent junction depth 115 and be composed of either silicon (Si) or silicon-carbide (Sic) having a doping concentration from about $1\times10^{18}$ cm$^{-3}$ to about $1\times10^{20}$ cm$^{-3}$, and preferably from about $5\times10^{18}$ cm$^{-3}$ to about $5\times10^{19}$ cm$^{-3}$.

FET 100 may also include a second accumulation channel layer 192 that may preferably be composed of silicon (Si) or silicon-carbide (SiC) and may be a negatively (N) doped semiconductor material 193 having a doping concentration 194 from about $1\times10^{15}$ cm$^{-3}$ to about $1\times10^{17}$ cm$^{-3}$, and preferably from about $1\times10^{16}$ cm$^{-3}$ to about $1\times10^{17}$ cm$^{-3}$. Second accumulation channel 192 may be located adjacent to an exterior surface of second side wall 135 and have a first end 195 in contact with the second surface 189 of N+ drain region 185. Second accumulation channel 192 may have a second end 196 in proximity to P-Junction gate 160 fourth surface 167. The first accumulation channel 155 and the second accumulation channel 192 may have a thickness 197 from between about 0.2 microns to about 0.5 microns, and preferably from about 0.3 microns and 0.5 microns. The first accumulation channel 155 second end 159 meets the P-Junction gate 160 third surface 166 at a first corner 198, while the second accumulation channel 192 second end 196 meets the P-Junction gate 160 fourth surface 167 at a second corner 199. The second accumulation channel 192 may have a length 169. The doped buffer layer 120 provides a second accumulation conducting channel along the second accumulation layer 192. The first accumulation layer 155 may be substantially identical to the second accumulation layer 192 both in length and thickness. A plurality of FET 100 cells may be connected in parallel to provide increased current handling capability. A top view (not shown) of the FET 100 may have a profile such as a square, rectangle, hexagon, or stripe. While particular materials having particular polarities are disclosed, opposite polarity materials may alternatively be used to construct an opposite polarity device.

Figure 2:
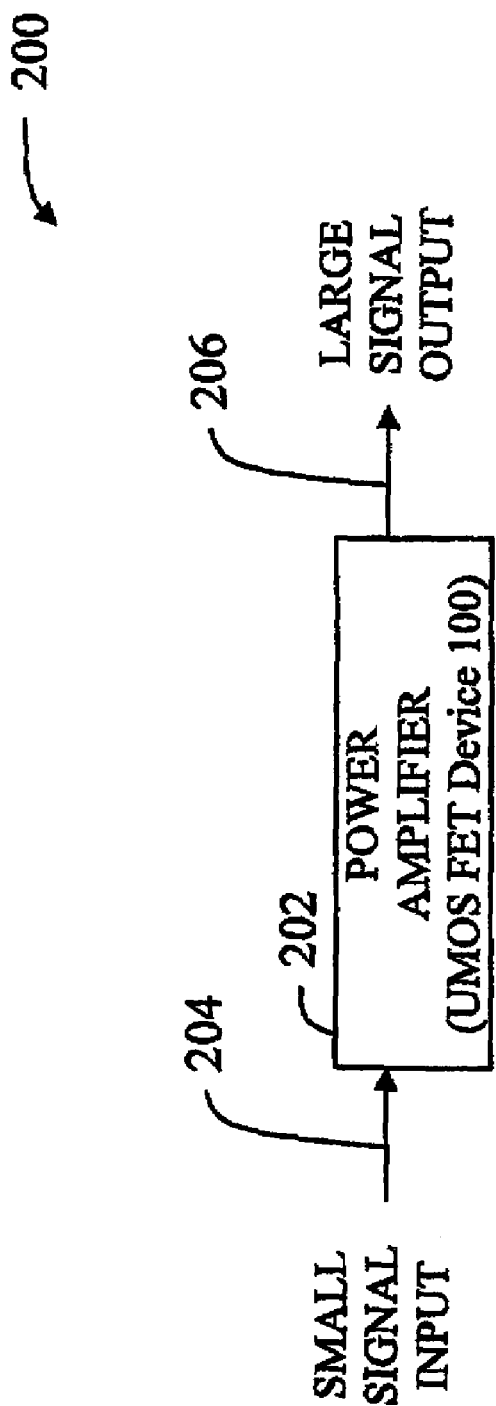
FIG. 2 shows an exemplary power amplifier using the UMOS FET, according to an embodiment of the present invention.

FIG. 2 shows a power amplifier using the FET 100, according to an embodiment of the present invention. A power amplifier 202, or other suitable device, includes a small signal input 204 and a large signal output 206 that is related in some way to the small signal input 204. Power connections, signal conditioning and support circuitry are not shown for the sake of clarity. In reference to FIGS. 1 and 2, a UMOS FET 100 as described may be used in an exemplary power amplifier by applying a controlling voltage to the device gate terminal 146 in the form of a small signal input 204. The field effect of this applied voltage on gate terminal 146 may be used to create a channel between the source 110 and drain 185 so that the controlling voltage applied to the UMOS FET is effective in controlling the flow of electrical current through the source terminal 116 and the drain terminal 191 in a power amplifier. Other applications of the disclosed UMOS FET 100 are possible.

Embodiments described above illustrate but do not limit the invention. It should also be understood that numerous modifications and variations are possible in accordance with the principles of the present invention. Accordingly, the scope of the invention is defined only by the following claims.

We claim:

1. A U-shape Metal-Oxide-Semiconductor (UMOS) device, comprising:
   a P-base layer;
   an N+ source region disposed in the P-base layer, the N+ source region having a first surface that is coplanar with a first surface of the P-base layer;
   a dielectric layer extending through the P-base layer and forming a U-shape trench having side walls and a floor enclosing a trench interior region;
   a conducting gate material filling the U-shape trench interior region;
   a first accumulation channel layer disposed along a first side wall of the H-shape trench and in contact with the N+ source region and the first side wall of the U-shape trench;
   a P-junction gate disposed adjacent to the dielectric layer floor and in proximity to the first accumulation channel layer;
   an N-drift region, wherein the P-junction gate is disposed between the dielectric layer and the N-drift region;
   a N+ drain region adjacent to a second wall of the U-shape trench, the second wall being disposed on a side opposite from the first side wall; and
   a second accumulation channel layer along the second side wall of the trench and in contact with the N+ drain region.

2. The device of claim 1, wherein the P-base layer is composed of a positively doped semiconductor material selected from the group consisting of silicon (Si) and silicon carbide (SiC), the P-base layer having a doping concentration of between about $1\times10^{16}$ cm$^{-3}$ and about $5\times10^{17}$ cm$^{-3}$, the P-base layer having a thickness of between about 1.0 microns and about 2.0 microns.

3. The device of claim 1, wherein the N+ source region is composed of negatively doped semiconductor material selected from the group consisting of silicon (Si) and silicon carbide (SiC), the source region having a doping concentration of between about $1\times10^{18}$ cm$^{-3}$ and about $1\times10^{20}$ cm$^{-3}$.

4. The device of claim 1, wherein the dielectric layer has a thickness of between about 500 Å and about 800 Å, the dielectric layer being composed of a dielectric material selected from the group consisting of silicon dioxide (Si02) and silicon nitride (Si3N4).

5. The device of claim 1, wherein the conducting gate material consists of a positively doped semiconductor material selected from the group consisting of silicon (Si), polysilicon, and silicon carbide (SiC), the gate material having a doping concentration of between about $5\times10^{17}$ cm$^{-3}$ to about $5\times10^{19}$ cm$^{-3}$, the gate material having a thickness from about 1.5 microns to about 2.0 microns.

6. The device of claim 1, wherein the first accumulation layer is composed of an N-type doped semiconductor material selected from the group consisting of silicon (Si) and silicon carbide (SiC), the first accumulation layer having a doping concentration of between about $1\times10^{15}$ cm$^{-3}$ to about $1\times10^{17}$ cm$^{-3}$, the first accumulation layer having a thickness from about 0.2 microns to about 0.5 microns.

7. The device of claim 1, wherein the P-junction gate is composed of a P-type doped semiconductor material selected from the group consisting of silicon (Si) and silicon carbide (SiC), the P-junction gate having a doping concentration of between about $5\times10^{17}$ cm$^{-3}$ and $5\times10^{18}$ cm$^{-3}$, the P junction gate being one of blanket doped and locally doped, the P-junction gate having thickness from about 0.3 microns to about 0.5 microns.

8. The device of claim 1, further comprising a doped buffer layer disposed between the P-base layer and the N-drift region, the dielectric layer extending through the P-base layer and into the doped buffer layer to form the U-shape trench, the doped buffer layer providing an accumulation conducting channel along the first accumulation layer.

9. The device of claim 8, wherein the doped buffer layer comprises a negatively doped semiconductor material having a doping concentration of between about $5\times10^{15}$ cm$^{-3}$ and about $5\times10^{16}$ cm$^{-3}$, the doped buffer layer having a thickness from about 1.0 microns to about 2.0 microns.

10. The device of claim 9, wherein a first side of the P-junction layer is directly adjacent to the dielectric layer and the remaining sides of the P-junction layer are in contact with the doped buffer layer.

11. The device of claim 1, wherein the N-drift region is composed of a negatively doped semiconductor material having a doping concentration of between about $2\times10^{14}$ cm$^{-3}$ and about $1\times10^{17}$ cm$^{-3}$, the N-drift region having a thickness from about 5 microns to about 200 microns.

12. The device of claim 1, further comprising a doped substrate, adjacent to the N-drift region, composed of a semiconductor material selected from the group consisting of silicon (Si) and silicon carbide (SiC), the doped substrate including a doped semiconductor material having a doping concentration from between about $1\times10^{18}$ cm$^{-3}$ to about $1\times10^{19}$ cm$^{-3}$.

13. The device of claim 1, wherein the drain region comprises a negatively doped semiconductor material having a doping concentration from between about $1\times10^{18}$ cm$^{-3}$ to about $5\times10^{19}$ cm$^{-3}$; and
wherein the second accumulation channel layer comprises a negatively doped semiconductor material having a doping concentration from about $1\times10^{15}$ cm$^{-3}$ to about $1\times10^{17}$ cm$^{-3}$, the second accumulation channel layer having a thickness from about 0.2 microns to about 0.5 microns.

14. The device of claim 13, further comprising a source terminal in contact with the N+ source region, a gate terminal in contact with the conducting gate material, and a drain terminal in contact with the N+ drain region, the source terminal, gate terminal, and drain terminal being composed of an electrically conductive material selected from the group consisting of aluminum (Al), copper (Cu), and nickel (Ni).

15. A gate structure for a U-shape Metal-Oxide-Semiconductor (UMOS) device, comprising:
a P-base layer having a first surface and a second surface;
a doped buffer layer having a first surface and a second surface, a portion of the doped buffer layer first surface being adjacent to the P-base second surface;
a dielectric layer extending through the P-base layer and into the doped buffer layer to form a U-shape trench having side walls and a floor enclosing a U-shape trench interior region;
a conducting gate material filling the U-shape trench interior region;
a P-junction gate having a first surface that is adjacent to the trench floor, remaining surfaces of the P-junction gate being in contact with the doped buffer layer;
a N-drift region having a first surface and a second surface, the N-drift region first surface being adjacent to the doped buffer layer second surface;
an N+ source region disposed in the P-base layer, the N+ source region having a first surface that is coplanar with the first surface of the P-base layer;
a first accumulation channel layer disposed along a first side wall of the U-shape trench and in contact with the N+ source region;
a N+ drain region adjacent to a second side wall of the U-shape trench, the second side wall being disposed on a side opposite from the first side wall; and
a second accumulation channel layer disposed along the second side wall of the U-shape trench and in contact with the N+ drain region.

16. The gate structure of claim 15, wherein a distance between the trench floor and the doped buffer layer second surface is sufficient to provide a junction depletion region wholly embedded within the doped buffer layer.

17. The gate structure of claim 15, wherein the dielectric layer has a thickness of between about 500 Å and about 800 Å, the dielectric layer being composed of a dielectric material selected from the group consisting of silicon dioxide (SiO2) and silicon nitride (Si3N4).

18. A method of using a UMOS field effect transistor (FET), the UMOS FET comprising:
a P-base layer;
an N+ source region disposed in the P-base layer, the N+ source region having a first surface that is coplanar with a first surface of the P-base layer, the N+ source region having a source terminal in electrical contact with the N+ source region;
a dielectric layer extending through the P-base layer and forming a U-shape trench having side walls and a floor enclosing a trench interior region;
a conducting gate material filling the U-shape trench interior region, the conducting gate material having a gate terminal in electrical contact with the conducting gate material;
a first accumulation channel layer along a first side wall of the U-shape trench and in contact with both the N+ source region and a first side wall of the U-shape trench;
a P-junction gate disposed adjacent to the dielectric layer floor and in proximity to the first accumulation channel layer;
an N-drift region, wherein the P-junction gate is disposed between the dielectric layer and the N-drift region;
a N+ drain region adjacent to a second side wall of the U-shape trench, the second side wall being disposed on a side opposite from the first side wall, the N+ drain region having a drain terminal in electrical contact with the N+ drain region; and
a second accumulation channel layer along the second side wall of the U-shape trench and in contact with the N+ drain region, and
wherein the method of using the UMOS FET comprises:
applying a controlling voltage to the gate terminal, the controlling voltage applied to the UMOS FET being effective in controlling the flow of electrical current through the source terminal and the drain terminal.

19. The method of claim 18, wherein the dielectric layer has a thickness of between about 500 Å and about 800 Å, the dielectric layer being composed of a dielectric material selected from the group consisting of silicon dioxide (Si02) and silicon nitride (Si3N4).

20. The method of claim 19, wherein the semiconductor material is selected from the group consisting of silicon (Si) and silicon-carbide (SiC).

21. A method of making a U-shape Metal-oxide-Semiconductor (UM0S) device, comprising:
providing a P-base layer having a first surface and a second surface;
providing a doped buffer layer having a first surface and a second surface, a portion of the doped buffer layer first surface being adjacent to the P-base second surface;
providing a dielectric layer extending through the P-base layer and into the doped buffer layer to form a U-shape trench having side walls and a floor enclosing a U-shape trench interior region;
providing a conducting gate material filling the U-shape trench interior region; and providing a P-junction gate having a first surface that is adjacent to the trench floor, remaining surfaces of the P-junction gate being in contact with the doped buffer layer, wherein a distance between the trench floor and the doped buffer layer second surface is sufficient to provide a junction depletion region wholly embedded within the doped buffer layer;

providing an N+ source region disposed in the P-base layer, the N+ source region having a first surface that is coplanar with a first surface of the F-base layer;

providing a first accumulation channel layer along a first side wall of the u-shape trench and in contact with the N+ source region and a first side wall of the U-shape trench, wherein the doped buffer layer provides an accumulation conducting channel along the first accumulation channel layer;

providing an N+ drain region disposed in the P-base layer, the N+ drain region having a first surface that is coplanar with a first surface of the P-base layer; and providing a second accumulation channel layer along a second side wall of the U-shape trench and in contact with the N+ drain region and a second side wall of the U-shape trench, wherein the doped buffer layer provides an accumulation conducting channel along the second accumulation channel layer.

22. The method of claim 21, further comprising:

providing an N-drift region adjacent to the doped buffer layer, wherein the P-junction gate is disposed between the dielectric layer and the N-drift region; and providing a doped substrate adjacent to the N-drift region on a side opposite from the P-base layer.

23. The method of claim 21, wherein first and second accumulation channel layers are composed of an N-type doped semiconductor material selected from the group consisting of silicon (Si) and silicon carbide (SiC) and having a doping concentration of between about $1 \times 10^{15}$ cm$^{-3}$ to about $1 \times 10^{17}$ cm$^{-3}$ and having a thickness from about 0.2 microns to about 0.5 microns.

24. The method of claim 21, further comprising a source terminal in contact with the N+ source region, a gate terminal in contact with the conducting gate material, and a drain terminal in contact with the N+ drain region, the source terminal, gate terminal, and drain terminal being composed of an electrically conductive material selected from the group consisting of aluminum (Al), copper (Ca), and nickel (Ni).

* * * * *